United States Patent
Ohnishi et al.

(10) Patent No.: US 8,516,310 B2
(45) Date of Patent: Aug. 20, 2013

(54) INFORMATION PROCESSING DEVICE EQUIPPED WITH WRITE-BACK CACHE AND DIAGNOSIS METHOD FOR MAIN MEMORY OF THE SAME

(75) Inventors: Naoya Ohnishi, Tokyo (JP); Hiroshi Nakatani, Tokyo (JP); Yoshito Sameda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 380 days.

(21) Appl. No.: 13/025,499

(22) Filed: Feb. 11, 2011

(65) Prior Publication Data

US 2012/0023374 A1    Jan. 26, 2012

(30) Foreign Application Priority Data

Jul. 20, 2010 (JP) .................................. 2010-163013

(51) Int. Cl.
   *G06F 11/00*    (2006.01)
(52) U.S. Cl.
   USPC ........................................................... 714/42
(58) Field of Classification Search
   USPC ............... 714/5.1, 5.11, 6.13, 6.2, 6.31, 6.32, 714/25–27, 30, 32, 41, 42, 48, 49, 54
   See application file for complete search history.

(56) References Cited

U.S. PATENT DOCUMENTS

| 4,872,166 | A | * | 10/1989 | Jippo | 714/6.13 |
|---|---|---|---|---|---|
| 5,381,544 | A | * | 1/1995 | Okazawa et al. | 714/5.11 |
| 5,875,293 | A | * | 2/1999 | Bell et al. | 714/27 |
| 2005/0060514 | A1 | * | 3/2005 | Pomaranski et al. | 711/202 |
| 2008/0307172 | A1 | * | 12/2008 | Abe | 711/156 |
| 2009/0089631 | A1 | * | 4/2009 | Kanamaru et al. | 714/719 |

FOREIGN PATENT DOCUMENTS

WO    WO 2007/055068 A1    5/2007

* cited by examiner

*Primary Examiner* — Nadeem Iqbal
(74) *Attorney, Agent, or Firm* — Oblon, Spivak, McClelland, Maier & Neustadt, L.L.P.

(57) ABSTRACT

The embodiments provide a failure diagnosis method for a main memory in an information processing device equipped with a write-back cache. According to the method, an application program stored in the main memory is divided by the storage size of write-back cache, and the regions are stored in advance. Then, a read signal from the main memory to the write-back cache is detected. It is determined whether the region corresponding to the read signal has yet to be diagnosed. If the region has yet to be diagnosed, a command to diagnose failure of the region is issued. If a write signal (write back) to a particular region is detected during the diagnosis of the particular region, the diagnosis of the particular region is stopped. Thus, the failure diagnosis of the main memory is executed in parallel with the execution of the application program.

4 Claims, 5 Drawing Sheets

INFORMATION PROCESSING DEVICE EQUIPPED WITH WRITE-BACK CACHE AND DIAGNOSIS METHOD FOR MAIN MEMORY OF THE SAME

CROSS REFERENCE TO RELATED APPLICATION

This application is based upon and claims the benefit of priority from Japanese Patent Application No. 2010-163013, filed on Jul. 20, 2010. The entire contents of which are incorporated herein by reference.

FIELD

The embodiments of the invention relate to an information processing device equipped with a write-back cache and also to a diagnosis method for a main memory of the information processing device.

BACKGROUND

An information processing device employed in an information processing system that must be highly safe and reliable needs a periodical diagnosis of a storage device. Since the storage device needs to be diagnosed for general memory failures and also memory soft errors attributable to radioactive particles, the diagnosis of the storage device has to be performed not only while the system is in the process of booting-up but also while the system is in operation.

In general, diagnosis of a memory is performed by a diagnosis method with a marching pattern, for example, more specifically, by firstly writing a predetermined value in a particular address of the memory and then by comparing the value read from the same address with the predetermined value thus written to check whether the two values are the same. Such methods make diagnoses by rewriting values stored in the memory. Accordingly, no diagnosis can be performed on the memory regions that are being accessed by the CPU.

In addition, an information processing devices such as a CPU generally uses storage devices in a hierarchical structure (the structure is called a storage hierarchy) including a fast, small-capacity memory (referred to as a cache memory) such as a SRAM that is provided between the information processing device and the main memory and is used for avoiding delays of the operation of slow, larger-capacity main memory such as a DRAM when acquiring or updating information such as programs or data.

The CPU usually accesses only the cache memory. There are two write control methods: the write-through method in which write accesses to the main memory and the cache memory are made simultaneously; and the write-back method in which the batch writing is performed on the main memory to minimize the write accesses to the main memory.

In some of storage devices equipped with cache memories, the cache memories block the direct access to the main memories. In this case, diagnosis of the main memories requires a special testing apparatus.

In addition, if a CPU in operation for information processing, itself, carries out memory diagnosis to ensure high safety and reliability, the CPU has to have such a heavy load for the diagnosis that constraints are added to the processing time for the information processing.

DETAILED DESCRIPTION

Figure 1:
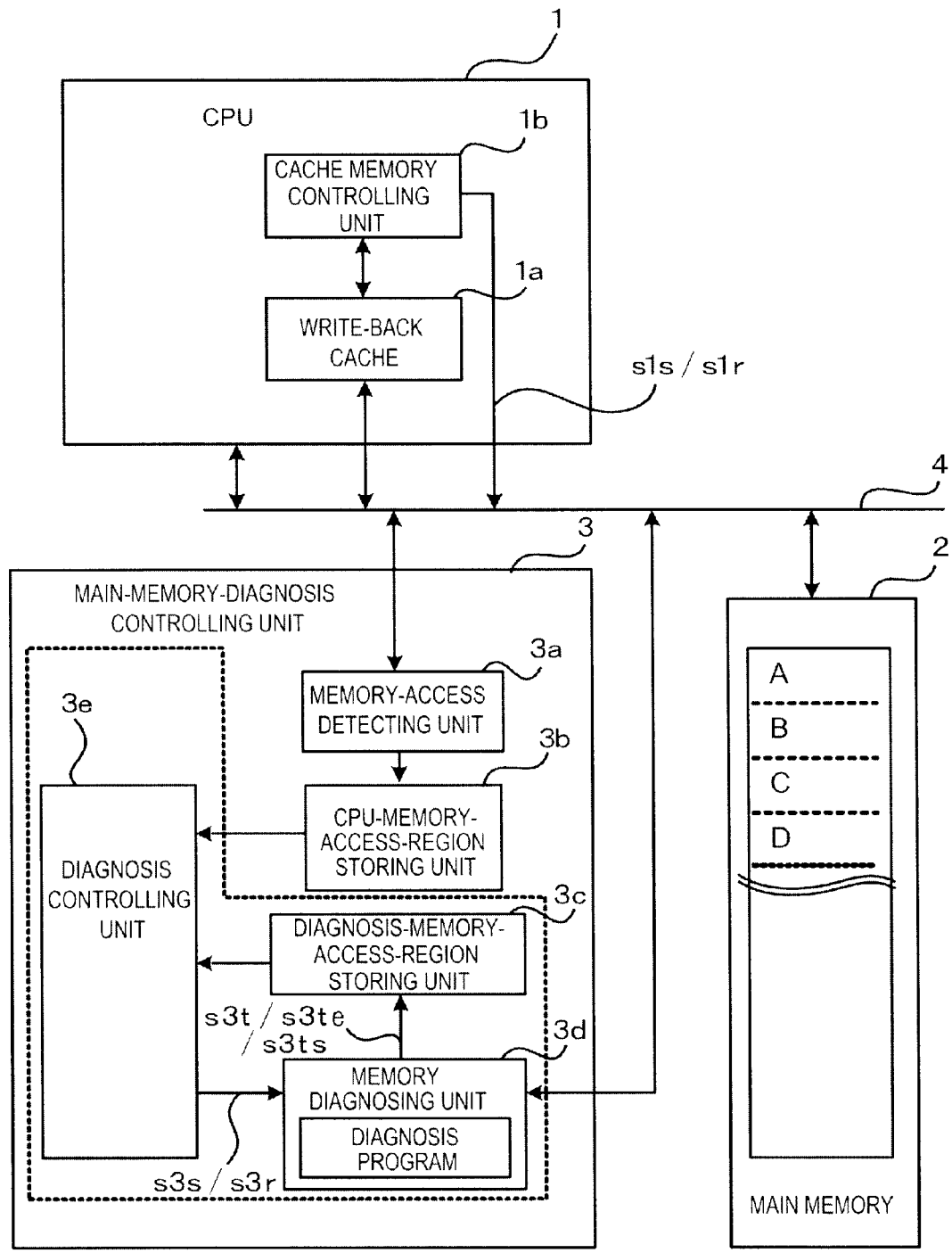
FIG. 1 is a configuration diagram of an information processing device of a first embodiment.

According to the first embodiment, provided is an information processing device equipped with a write-back cache including: a CPU including a write-back cache; a main memory configured to store an application program to be executed by the CPU and to serve as a lower stratum of the write-back cache; and a main-memory diagnosis controlling unit configured to diagnose failure of the main memory and including: a memory-access detecting unit configured to detect addresses of the main memory accessed by the CPU from a read signal from the main memory to the write-back cache and a write signal to the main memory; a CPU-memory-access-region storing unit configured to store the accessed addresses of the main memory detected by the memory-access detecting unit from the read signal and the write signal; a diagnosis-memory-access-region storing unit configured to store, in advance, a plurality of regions formed by dividing the application program by the storage size of the write-back cache and to store whether each of the regions is during, after or before diagnosis; a diagnosis controlling unit configured to refer to the diagnosis-memory-access-region storing unit to determine whether the region stored in the CPU-memory-access-region storing unit has yet to be diagnosed, configured to send a diagnosis command for the region if determining that the region has yet to be diagnosed, and configured to send a diagnosis-stop command if the region is cached and also if a write-back signal for the region is received from the CPU-memory-access-region storing unit before a diagnosis-finish signal is received from the diagnosis-memory-access-region storing unit; and a memory diagnosing unit configured to store a preset memory-diagnosis program, configured to execute the diagnosis of the region in response to the diagnosis command sent from the diagnosis controlling unit and to send both a diagnosis-finish signal to the diagnosis-memory-access-region storing unit and a diagnostic result to the CPU, and configured to stop the diagnosis in response to the diagnosis-stop command and to send a diagnosis-stop signal to the diagnosis-memory-access-region storing unit, wherein failure diagnosis of the main memory is executed for each of the regions divided corresponding to the write-back cache, in parallel with the execution of the application program by the CPU.

According to the first embodiment, provided is a failure diagnosis method for a main memory in an information processing device equipped with a write-back cache including the steps of: storing, in advance, regions formed by dividing, by a storage size of the write-back cache, an application program stored in the main memory; detecting a read signal from the main memory to the write-back cache, then determining whether the region corresponding to the read signal has yet to be diagnosed, and then issuing a command to perform failure diagnosis of the region if the region has yet to be diagnosed; and stopping the diagnosis of the region if a write signal to the region is detected during the diagnosis of the region, wherein the diagnosis of memory failure of the region is executed during a period starting from the end of the reading from the main memory to the write-back cache until occurrence of writing to the region, and thereby the failure diagnosis of the main memory is executed in parallel with execution of the application program.

Embodiments will be described below with reference to the drawings.

[First Embodiment]

An information processing device equipped with a write-back cache according to a first embodiment will be described below with reference to FIGS. 1 to 3.

FIG. 1 is a configuration diagram of a control device equipped with a write-back cache of the invention. The control device shown in FIG. 1 includes a CPU 1 equipped with a write-back cache, a main memory 2 configured to store application programs executed by the CPU 1 and to serve as a lower stratum of the write-back cache, and a main-memory-diagnosis controlling unit 3 configured to diagnose a failure of the main memory 2. A bus 4 is provided to connect the CPU 1, the main memory 2, and the main-memory-diagnosis controlling unit 3 to one another.

Next, the configurations of the units will be described. The CPU (Central Processing Unit, also known as MPU) 1 includes a write-back cache 1a and a cache controlling unit 1b, for example. The write-back cache 1a is formed of a fast, small-capacity SRAM of several kilobytes to several hundred kilobytes. The cache controlling unit 1b controls the reading (called "filling") from the main memory 2 to the write-back cache 1a, and also controls the writing (called "write back") of data in the write-back cache 1a back to the main memory 2 at the timing of releasing (called "flashing") the write-back cache 1a when all the data in the write-back cache 1a becomes valid data.

The main memory 2, which is the target for the failure diagnosis, stores both the programs and data of application programs. The main memory 2 is usually formed of a slow, large-capacity DRAM of several tens of megabytes to several hundred megabytes, for example. The storage means, however, is not limited to a DRAM. The main memory 2 is sometimes formed of an auxiliary storage device such as a hard disk device.

The main-memory-diagnosis controlling unit 3 includes a memory-access detecting unit 3a, a CPU-memory-access-region storing unit 3b, and a diagnosis-memory-access-region storing unit 3c. The memory-access detecting unit 3a detects the addresses of the main memory 2, which are accessed by the CPU 1, via the bus 4 on the basis of a read signal from the main memory 2 to the write-back cache 1a (upon completion of the reading) or a write signal (write-back signal) to the main memory 2 (upon start of the writing). The CPU-memory-access-region storing unit 3b stores the addresses of the main memory 2 accessed by the CPU and detected by the memory-access detecting unit 3a on the basis of the read signal and write signal. The diagnosis-memory-access-region storing unit 3c stores, in advance, plural regions (e.g., regions A to D) formed by dividing the application programs by the storage size of the write-back cache 1a. The diagnosis-memory-access-region storing unit 3c stores whether each of the regions is during, after or before diagnosis.

The main-memory-diagnosis controlling unit 3 also includes a memory diagnosing unit 3d and a diagnosis controlling unit 3e. The diagnosis controlling unit 3e determines, by referring to the diagnosis-memory-access-region storing unit 3c, whether or not each of the regions stored in the CPU-memory-access-region storing unit 3b has yet to be diagnosed. If a particular region has yet to be diagnosed, the diagnosis controlling unit 3e sends a diagnosis command (s3s) for the particular region. If a particular region is cached, and at the same time, if the diagnosis controlling unit 3e receives a write-back signal for the particular region from the CPU-memory-access-region storing unit 3b before receiving a diagnosis-finish signal from the diagnosis-memory-access-region storing unit 3c, the diagnosis controlling unit 3e sends a diagnosis-stop command (s3r). The memory diagnosing unit 3d stores a pre-set memory-diagnosis program. The memory diagnosing unit 3d executes the diagnosis of a particular region in response to a diagnosis command (s3s) sent from the diagnosis controlling unit 3e. The memory diagnosing unit 3d sends a diagnosis-finish signal (s3te) or a diagnosis-stop command signal (s3ts) to the diagnosis-memory-access-region storing unit 3c. The diagnosis-finish signal (s3te) is sent when the diagnosis is finished and the diagnosis-stop command signal (s3ts) is sent when the diagnosis is stopped in response to a diagnosis-stop command (s3r). When the diagnosis is finished, the memory diagnosing unit 3d sends the diagnostic result to the CPU 1.

Next, description will be given of the configuration of the memory diagnosing unit 3d equipped with a diagnostic program to diagnose each of the regions of the main memory 2.

The memory diagnosing unit 3d diagnoses whether there is a memory failure in the following way. First, the memory diagnosing unit 3d writes data of a particular pattern to a cached, diagnosis-target region of the main memory 2. Then, the memory diagnosing unit 3d reads the written data from the diagnosis-target region. Then, the memory diagnosing unit 3d compares the written data and the read data with each other.

Data of various kinds of patterns can be used as the above-mentioned data of a particular pattern. An example is the pattern known as checkerboard, in which strings of 0x55555555 and 0xAAAAAAAA are written to the memory region to be diagnosed. Marching patterns can also be used for the same purpose. Which diagnostic algorithm is to be used can be determined by considering the extent of reliability that the diagnosis needs to have and the allowable time that the diagnosis can take.

The memory diagnosing unit 3d writes the address of the region being diagnosed to the diagnosis-memory-access-region storing unit 3c. In the meanwhile, the diagnosis controlling unit 3e refers to both the CPU-memory-access-region storing unit 3b and the diagnosis-memory-access-region storing unit 3c, thereby checking that the cached region and the memory-diagnosed region are the same region. Once the identity of the regions can be checked, the diagnosis controlling unit 3e executes the diagnosis. After the memory diagnosis is finished, the diagnosis controlling unit 3e writes the fact that the diagnosis of the region is finished to the diagnosis-memory-access-region storing unit 3c. In addition, the diagnosis controlling unit 3e sends the diagnostic result to the CPU 1 via the bus 4.

The entire main-memory-diagnosis controlling unit 3 may be provided by an FPGA (Field Programmable Gate Array). An alternative configuration may be constructed as follows. An FPGA is provided as both the memory-access detecting unit 3a and the CPU-memory-access-region storing unit 3b while a CPU that is similar to the CPU 1 is provided as the other diagnostic constituent portions (the portions enclosed by the dashed lines). The CPU receives the signals for the access to the main memory 2 via the bus 4 from the portions of FPGA, and then performs the necessary processing to execute the access.

This configuration, that is, a configuration including a CPU serving as the diagnosing unit of the main-memory-diagnosis controlling unit 3, has an effect to facilitate both the changing of the patterns used for the diagnosis of the main memory 2 and the self-diagnosis of the diagnosing unit.

Figure 2A:
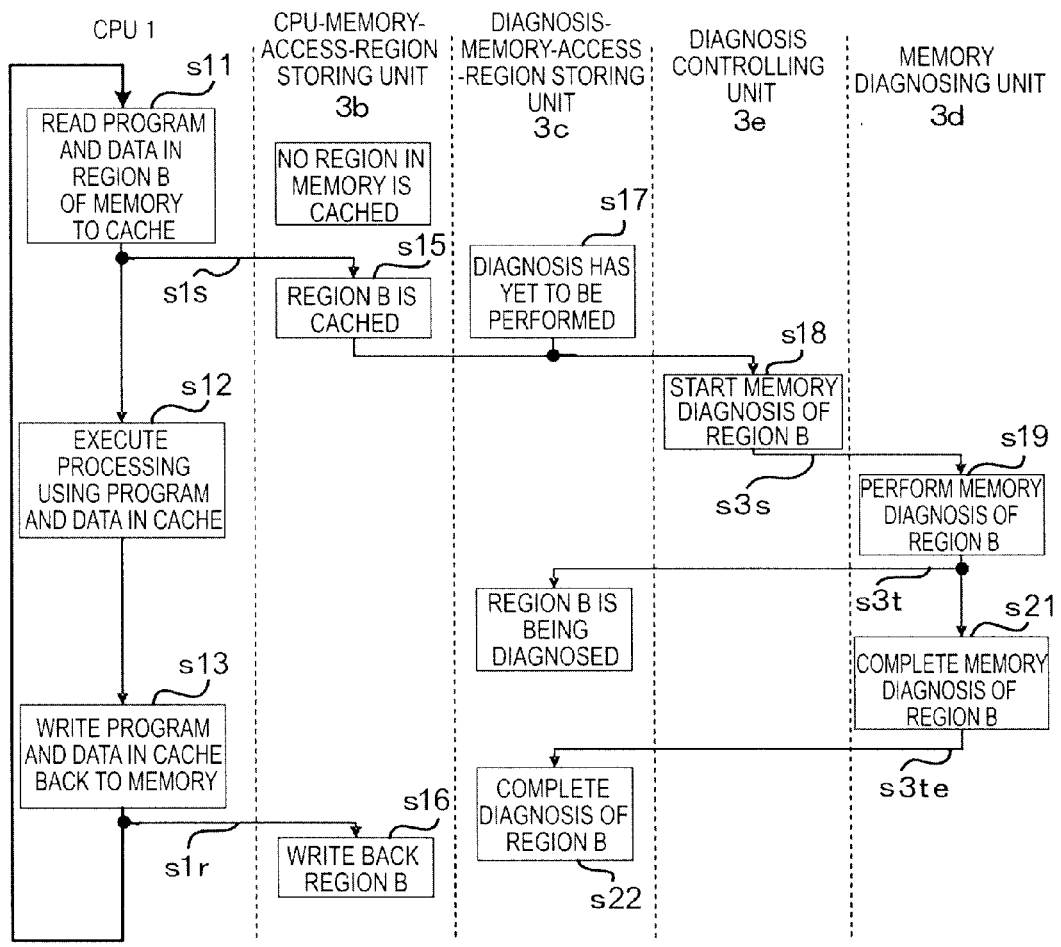
FIG. 2 is an operation explanatory diagram of the information processing device of the first embodiment.
Figure 2B:

Next, the operations of the information processing device equipped with the write-back cache 1a configured as described above will be described with reference to FIGS. 2A and 2B. FIG. 2A is a flowchart illustrating the operations. FIG. 2B is a time chart for the operations.

Firstly, the operations of the CPU 1 will be described with reference to FIG. 2A. The cache-memory controlling unit 1b generates a read signal s1s. Then, cache-memory controlling unit 1b reads, from the application program stored in the main memory 2, the program and the data in a region B, for example, to the write-back cache 1a (s11).

Then, the CPU 1 executes the program with the program and data written in the write-back cache 1a (s12). When the predetermined program is executed and a write signal (write-back signal) to the main memory 2 is generated from the cache-memory controlling unit 1b, the CPU 1 writes the program and data corresponding to the designated region back to the main memory 2 (s13).

Then, in response to the next read signal s1s from the cache-memory controlling unit 1b, the program in the corresponding region of main memory 2 is read (s11). From then onwards, similar operations (i.e., s11 to s13) are executed repeatedly.

Next, description will be given of the memory diagnosing operations performed, by the main-memory-diagnosis controlling unit 3, for each of the regions of the main memory 2 of the controlling device equipped with the write-back cache 1a.

If the CPU 1, specifically, the memory-access detecting unit 3a, detects the read signal s1s for the region B, for example, via the bus 4, the CPU-memory-access-region storing unit 3b stores the accessed address (s15).

Then, the diagnosis controlling unit 3e refers to the diagnosis-memory-access-region storing unit 3c to determine whether the region stored in the CPU-memory-access-region storing unit 3b by the access (s11) has yet to be diagnosed (s17). If the region has yet to be diagnosed, the diagnosis controlling unit 3e sends a diagnosis-command signal s3s of diagnose the region (s18) to the memory diagnosing unit 3d.

Then the memory diagnosing unit 3d executes the diagnosis of the region B (s19), and sends a signal s3t indicating the diagnosis is going on. When the diagnosis is finished, the memory diagnosing unit 3d sends a diagnosis-finish signal s3te to the diagnosis-memory-access-region storing unit 3c (s21). The diagnosis-finish signal s3te is then stored in the diagnosis-memory-access-region storing unit 3c (s22). Moreover, the diagnostic result is sent to the CPU via the bus 4.

The above-described operations are shown in the time chart of FIG. 2B. As FIG. 2B shows, the main-memory-diagnosis controlling unit 3 executes automatically each of the regions formed by dividing the main memory 2, in parallel to the execution of the application program by the CPU 1 by using a period (signal s3t indicating the diagnosis is going on) from the end of the writing of data in the region to the write-back cache 1a until the generation of the data write signal to the main memory 2.

Figure 3A:
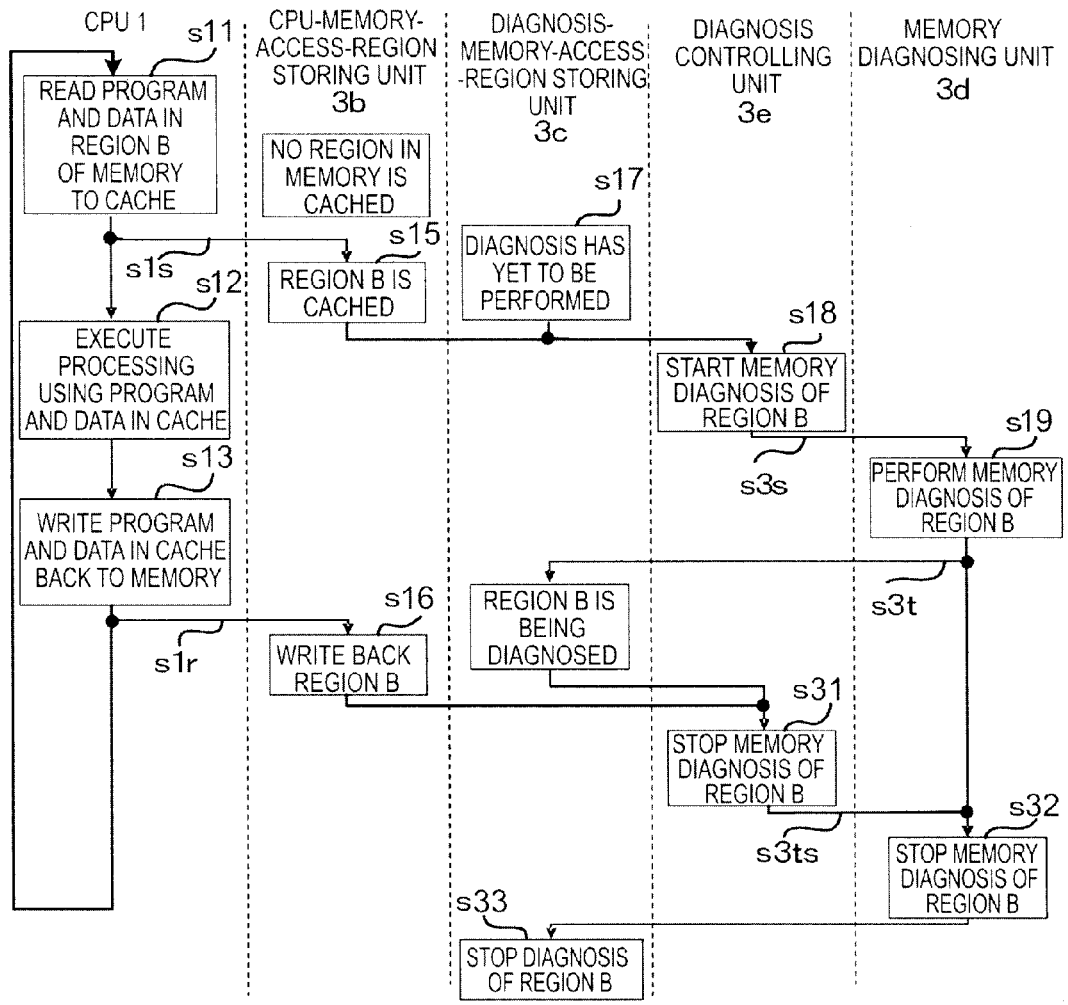
FIG. 3 is an operation explanatory diagram of the information processing device of the first embodiment.
Figure 3B:
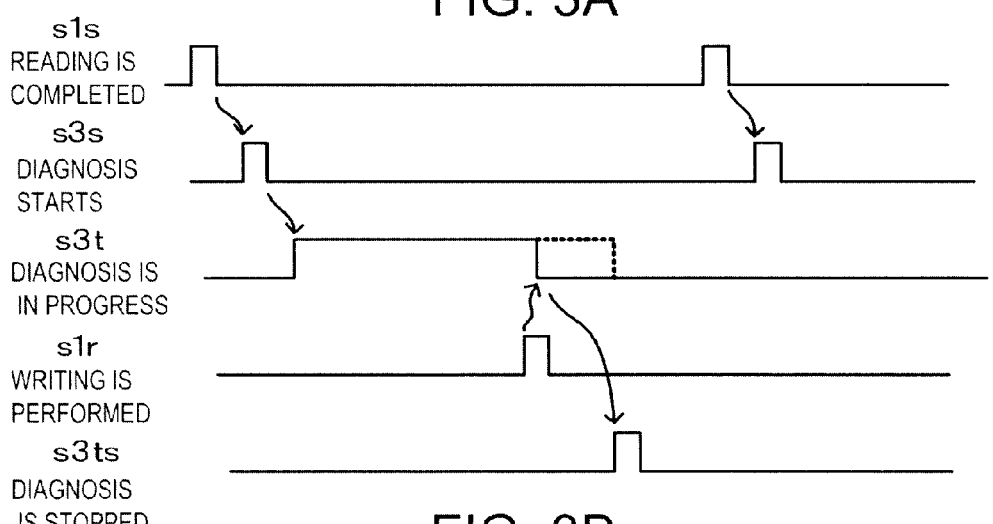

Next, description will be given, with reference to FIGS. 3A and 3B, of the operations of a case where, while the memory diagnosing unit 3d is diagnosing a particular region of the main memory 2, a writing to the particular region is detected.

If the diagnosis controlling unit 3e receives, from the CPU-memory-access-region storing unit 3b, a write signal (s1r) to a particular region before the diagnosis-memory-access-region storing unit 3c finishes the diagnosis of the particular region, that is, if the diagnosis controlling unit 3e receives a write-back signal (s16), the diagnosis controlling unit 3e sends a diagnosis-stop signal (s3ts) to the memory diagnosing unit 3d (s31).

Upon receiving the diagnosis-stop command s3r, the memory diagnosing unit 3d stops the diagnosis of the particular region (s32), and sends the diagnosis-stop signal s3ts to the diagnosis-memory-access-region storing unit 3c. The diagnosis-stop signal s3ts is then stored in the diagnosis-memory-access-region storing unit 3c (s33).

Thus, the main-memory-diagnosis controlling unit 3 diagnoses each focused one of the regions of the main memory 2 that are cached by the CPU 1 in parallel with the execution of the application program by using the period started from when the CPU 1 completes the writing, to the write-back cache 1a, of the divided piece of the program stored in the focused region of the main memory 2, and ended at when the CPU 1 executes the write back to the main memory 2 after executing processing using the divided piece of the program cached in the write-back cache 1a corresponding to the focused region.

The information processing devices used in industrial systems and public systems need to run continuously, so that the failure diagnosis of the main-memory in the information processing devices of such usages are conventionally performed periodically on either a semiannual or annual basis. According to the embodiment, however, the diagnosis can be performed while the information processing device is running, so that the diagnosis can be performed on a shorter-period basis. Consequently, the safety and the reliability of the system can be improved.

The embodiment can provide the information processing device equipped with a write-back cache and the main-memory diagnosing method of the information processing device that are capable of diagnosing the main memory without affecting the operations of the application program while the information processing device is running the application program.

[Second Embodiment]

Next, an information processing device equipped with a write-back cache of a second embodiment will be described with reference to FIGS. 4 and 5. Those portions of the second embodiment that are identical to the portions shown in FIG. 1 are denoted by the same reference numerals used in the first embodiments. No description for such portions will be given.

Figure 4:
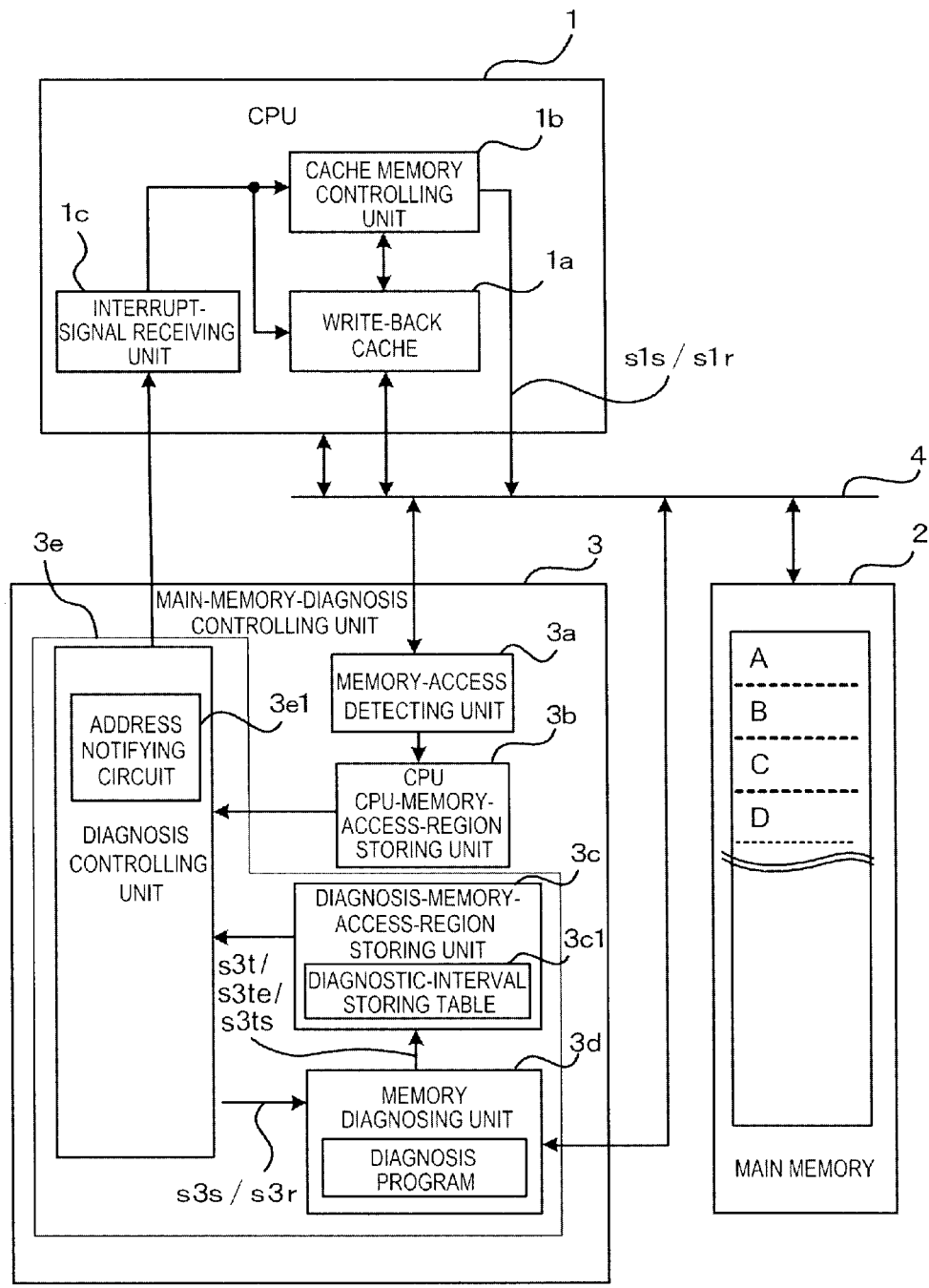
FIG. 4 is a configuration diagram of an information processing device of a second embodiment.

As FIG. 4 shows, the diagnosis-memory-access-region storing unit 3c of the second embodiment has a diagnostic-interval time table 3c1. The diagnostic-interval time table 3c1 stores the diagnostic-interval time at which the memory diagnosing unit 3d diagnoses each of the regions formed by dividing the main memory 2 by the storage size of the write-back cache 1a. In addition, the diagnosis controlling unit 3e of the second embodiment includes an address notifying circuit 3e1 configured to determine whether the diagnostic-interval time for each region exceeds a predetermined threshold and to notify the CPU 1 of the addresses of such regions. In addition, the CPU 1 of the second embodiment includes an interrupt-signal receiving unit 1c which is the destination of the above-mentioned notification of the addresses. These are the difference between the first and the second embodiments.

Figure 5:
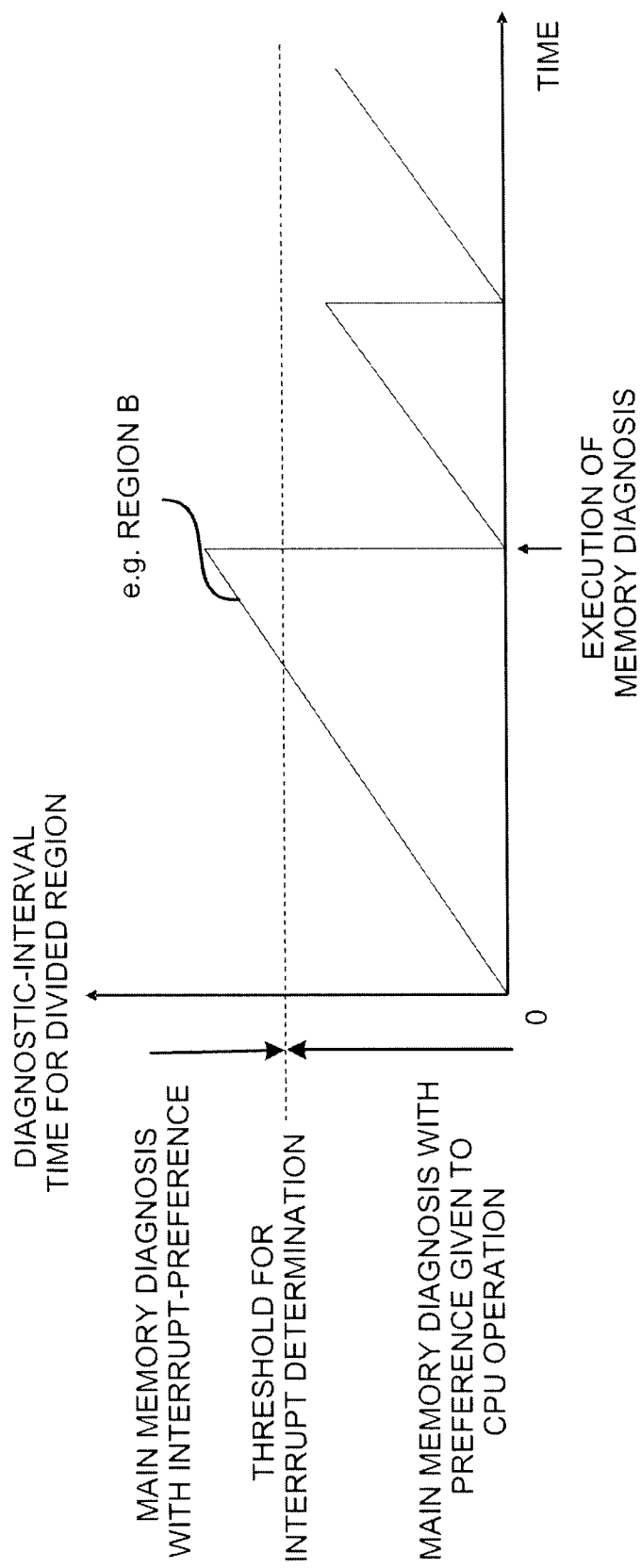
FIG. 5 is an explanatory diagram of the diagnostic operations of the second embodiment.

The diagnostic-interval time table 3e1 measures, as FIG. 5 shows, the readout diagnosis time for each region, and writes the readout diagnosis time to the diagnostic-interval time table 3c1. The diagnosis of each region is performed usually according to diagnostic-interval time that depends on the application program stored in the main memory 2.

According to the second embodiment, if any particular region has a long interval of the access by the CPU 1 to the diagnosis-target main memory 2 (i.e., a long diagnostic-interval time), the address notifying circuit 3e1 generates an interrupt signal, and preferentially performs the diagnosis of the region that exceeds the predetermined threshold. Accordingly, the diagnosis regions of the main memory 2 can be reliably diagnosed at least at constant intervals. In addition, the diagnostic-interval time for each region varies less from that for the other regions.

In addition, different thresholds can be set among regions to preferentially diagnose a particular region, or to preferentially diagnose a particular address.

The invention is not limited to the embodiments described above. Rather, the invention may be applied to any information processing device where a particular region of the main memory 2 is automatically diagnosed while the CPU 1 is executing operations using a program cached in the write-back cache 1a until the CPU 1 performs the write back to the main memory 2. The configuration of the main-memory-diagnosis controlling unit 3 may be modified in various ways without departing from the essence of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing device equipped with a write-back cache comprising:
    a CPU including a write-back cache;
    a main memory configured to store an application program to be executed by the CPU and to serve as a lower stratum of the write-back cache; and
    a main-memory diagnosis controlling unit configured to diagnose failure of the main memory and including:
        a memory-access detecting unit configured to detect addresses of the main memory accessed by the CPU from a read signal from the main memory to the write-back cache and a write signal to the main memory;
        a CPU-memory-access-region storing unit configured to store the accessed addresses of the main memory detected by the memory-access detecting unit from the read signal and the write signal;
        a diagnosis-memory-access-region storing unit configured to store, in advance, a plurality of regions formed by dividing the application program by the storage size of the write-back cache and to store whether each of the regions is during, after or before diagnosis;
        a diagnosis controlling unit configured to refer to the diagnosis-memory-access-region storing unit to determine whether the region stored in the CPU-memory-access-region storing unit has yet to be diagnosed, configured to send a diagnosis command for the region if determining that the region has yet to be diagnosed, and configured to send a diagnosis-stop command if the region is cached and also if a write-back signal for the region is received from the CPU-memory-access-region storing unit before a diagnosis-finish signal is received from the diagnosis-memory-access-region storing unit; and
        a memory diagnosing unit configured to store a preset memory-diagnosis program, configured to execute the diagnosis of the region in response to the diagnosis command sent from the diagnosis controlling unit and to send both a diagnosis-finish signal to the diagnosis-memory-access-region storing unit and a diagnostic result to the CPU, and configured to stop the diagnosis in response to the diagnosis-stop command and to send a diagnosis-stop signal to the diagnosis-memory-access-region storing unit, wherein
    failure diagnosis of the main memory is executed for each of the regions divided corresponding to the write-back cache, in parallel with the execution of the application program by the CPU.

2. The information processing device equipped with a write-back cache according to claim 1, wherein
    the diagnosis-memory-access-region storing unit includes a diagnostic-interval storing table to measure and store a diagnostic-interval time for each region, and
    the diagnosis controlling unit includes an address notifying circuit configured to determine whether the diagnostic-interval time stored in the diagnostic-interval storing table exceeds a predetermined threshold for interrupt-preference determination, and to notify an interrupt-signal receiving unit in the CPU of the address of the region if the diagnostic-interval time exceeds the threshold.

3. A failure diagnosis method for a main memory in an information processing device equipped with a write-back cache comprising the steps of:
    storing, in advance, regions formed by dividing, by a storage size of the write-back cache, an application program stored in the main memory;
    detecting a read signal from the main memory to the write-back cache, then determining whether the region corresponding to the read signal has yet to be diagnosed, and then issuing a command to perform failure diagnosis of the region if the region has yet to be diagnosed; and
    stopping the diagnosis of the region if a write signal to the region is detected during the diagnosis of the region, wherein
    the diagnosis of memory failure of the region is executed during a period starting from the end of the reading from the main memory to the write-back cache until occurrence of writing to the region, and thereby the failure diagnosis of the main memory is executed in parallel with execution of the application program.

4. The failure diagnosis method for a main memory in an information processing device equipped with a write-back cache according to claim 3, further comprising a step of measuring a diagnostic-interval time for each of the regions, then determining whether the diagnostic-interval time exceeds a predetermined threshold for interrupt-preference determination, and then performing preferentially the diagnosis of the region if the diagnostic-interval time exceeds the threshold.

* * * * *